(12) United States Patent
Nakamura (10) Patent No.: US 8,097,530 B2
(45) Date of Patent: Jan. 17, 2012

(54) METHOD FOR MANUFACTURING SIC SEMICONDUCTOR DEVICE

(75) Inventor: Hiroki Nakamura, Handa (JP)

(73) Assignee: DENSO CORPORATION, Kariya (JP)

( * ) Notice: Subject to any disclaimer, the term of this patent is extended or adjusted under 35 U.S.C. 154(b) by 674 days.

(21) Appl. No.: 12/155,766

(22) Filed: Jun. 10, 2008

(65) Prior Publication Data

US 2008/0318400 A1 Dec. 25, 2008

(30) Foreign Application Priority Data

Jun. 21, 2007 (JP) ................. 2007-164091

(51) Int. Cl.
*H01L 21/265* (2006.01)

(52) U.S. Cl. ........ 438/522; 438/465; 438/510; 438/514; 438/766; 257/E29.297; 257/E21.335; 257/E21.603

(58) Field of Classification Search .......... 257/E29.297–E29.298, E21.603, E21.605, E21.058, E21.066, 257/E21.335; 438/500–530
See application file for complete search history.

(56) References Cited

U.S. PATENT DOCUMENTS

2005/0233539 A1 10/2005 Takeuchi et al.

FOREIGN PATENT DOCUMENTS

| JP | A-2002-184712 | 6/2002 |
|---|---|---|
| JP | A-2002-184713 | 6/2002 |
| JP | A-2002-184714 | 6/2002 |
| JP | A-2002-286546 | 10/2002 |
| JP | A-2003-68669 | 3/2003 |
| JP | A-2003-77855 | 3/2003 |
| JP | A-2005-260267 | 9/2005 |
| JP | A-2005-303010 | 10/2005 |
| JP | A-2007-281005 | 10/2007 |

OTHER PUBLICATIONS

T. Kimoto, et al., "1200 V-Class 4H-SiC RESURF MOSFETs with Low On-Resistances," Proceedings on the 17$^{th}$ International Symposium on Power Semiconductor Devices & IC's, *IEEE*, (2005).
E. Oliviero, et al., "High energy N$^+$ion implantation in 4H-SiC," *Nuclear Instruments and Methods in Physics Research*, Vo. 257, (2007), pp. 265-.
S. Sundaresan, "Ultra-low resistivity Al$^+$implanted 4H-SiC obtained by microwave annealing and a protective graphite cap," *Solid-State Electronics*, vol. 52, (2008), pp. 140-145.
Extended European Search Report dated Oct. 8, 2009 issued from the European Patent Office in the corresponding European patent application No. 08010467.2-2203.

*Primary Examiner* — N Drew Richards
*Assistant Examiner* — Mamadou Diallo
(74) *Attorney, Agent, or Firm* — Posz Law Group, PLC

(57) ABSTRACT

A method for manufacturing a SiC semiconductor device includes: forming an impurity layer in a SiC layer; and forming an oxide film on the SiC layer. The forming the impurity layer includes: implanting an impurity in the SiC layer; applying a cap layer on the SiC layer; annealing the cap layer to be transformed a carbon layer; annealing the SiC layer to activate the impurity; and removing the carbon layer. The annealing the SiC layer includes: increasing a temperature of the SiC layer from a second temperature to a first temperature within a first time duration; and decreasing the temperature of the SiC layer from the first temperature to the second temperature within a second time duration. The first temperature is equal to or higher than 1800° C., and the second temperature is lower than 1800° C. The first and second time durations are small.

10 Claims, 9 Drawing Sheets

METHOD FOR MANUFACTURING SIC SEMICONDUCTOR DEVICE

CROSS REFERENCE TO RELATED APPLICATION

This application is based on Japanese Patent Application No. 2007-164091 filed on Jun. 21, 2007, the disclosure of which is incorporated herein by reference.

FIELD OF THE INVENTION

The present invention relates to a method for manufacturing a SiC semiconductor device.

BACKGROUND OF THE INVENTION

A Si atom is removed from a SiC surface of a SiC power device when an activation heat treatment is performed in a step of forming an impurity layer, so that the SiC surface is roughened. When the Si atom is removed, a carbon rich layer is formed on the SiC surface. It is necessary to remove the carbon rich layer for reducing a leak current and for protecting the device from generating failure. Accordingly, to remove the carbon rich layer, a step for forming a sacrifice oxidation film and a step for removing the sacrifice oxidation film are added.

The step for forming the sacrifice oxidation film is a thermal oxidation process. In the thermal oxidation process, a region in which an impurity is implanted is oxidized with a thermal oxidation speed, which is much different from that of a region in which no impurity is implanted. Specifically, the thermal oxidation speed in the implanted region is larger than that in the non-implanted region so that the implanted region is oxidized rapidly. Accordingly, the thickness of the thermal oxidation film in the implanted region is larger than that in the non-implanted region.

Thus, when the sacrifice oxidation film is removed in a HF acid process, the implanted region provides a concavity (a constricted part), compared with the non-implanted region. This is because the thickness of the thermal oxidation film in the implanted region is large. This concavity may cause deviation of thickness in a step for forming a gate oxide film. Thus, reliability of the gate oxide film is reduced.

To improve the above difficulty, a method for reducing surface roughness is disclosed in, for example, JP-A-2005-260267. Specifically, an organic film such as a photo resist is patterned, and then, an impurity ion is implanted. After that, the organic film is carbonized so that a graphite film is formed. The graphite film is used for a mask in an annealing process with high temperature.

In the above method, the graphite film functions as a mask, and thereby, the surface roughness under the mask is improved.

Another method for improving the surface roughness is disclosed in JP-2005-303010. Specifically, after a drift layer is epitaxially grown, a Si atom is sublimated in a vacuum high temperature anneal process, so that a homogeneous carbon layer is formed. The carbon layer is used for a cap layer in an activation process, in which an impurity layer is annealed so that the impurity layer is activated. Thus, when the carbon layer is used, an impurity included in organic solvent is not diffused into the SiC substrate. This feature is similar to the graphite film. Thus, device characteristics are not deteriorated.

However, in the method disclosed in JP-A-2005-260267, the graphite film is made of the organic film having a predetermined pattern, which is used for ion implantation. Therefore, a region corresponding to the opening of the organic film for the ion implantation is not covered with the graphite film.

Thus, the Si atom is sublimated in the anneal step with high temperature from the opening that is not covered with the graphite film, and thereby, the carbon rich layer is formed in the opening. Accordingly, when the device is formed, the carbon rich layer is removed in the sacrifice oxidation process. The step for forming the sacrifice oxidation film and the step for removing the sacrifice oxidation film are added. Thus, the concavity is produced from rapid oxidation.

In the method disclosed in JP-A-2005-303010, after the carbon layer is formed, a $SiO_2$ film is formed on the carbon layer in order to perform selective ion implantation. After the film is processed by a photo etching step, the ion implantation step is performed.

When the $SiO_2$ film is formed on the carbon layer made of amorphous film, adhesiveness between the $SiO_2$ film and the carbon layer may be insufficient. Thus, when the $SiO_2$ film is processed to have a fine pattern, the $SiO_2$ film as the mask may be removed (i.e., may peel off) from the carbon layer. Thus, the $SiO_2$ film does not function as the mask sufficiently. Thus, the device performance may be reduced.

JP-A-2005-303010 teaches that ion implantation step is performed after the carbon layer is formed. Thus, the $SiO_2$ film is formed on the carbon layer, and the $SiO_2$ film is patterned in a photo etching process. Then, the ion implantation step is performed.

However, when the $SiO_2$ film is formed on the carbon layer as an amorphous layer, the adhesiveness between the $SiO_2$ film and the carbon layer is not sufficient. Thus, when the $SiO_2$ film is patterned with a fine pattern, the $SiO_2$ film as a mask is removed from the carbon layer. Thus, the $SiO_2$ film does not function as a mask for the ion implantation step, so that the performance of the device is reduced.

Further, in JP-A-2005-303010, after the ion implantation step is performed in order to form an impurity layer, the carbon layer is formed. After the drift layer is epitaxially grown, a Si component on the surface of the drift layer is sublimated so that the carbon layer is formed on the surface of the drift layer. In this case, by performing a series of steps, the carbon layer is formed. However, it is necessary to add the ion implantation step before the carbon layer is formed.

Further, when the carbon layer is formed after the ion implantation step, an impurity region is formed together with the carbon layer. Thus, in the impurity region, crystal structure is distorted. Accordingly, when the carbon layer is formed at a high temperature in a range between 1100° C. and 1400° C., carbonizing speed (or sublimation speed of the Si atom) in the impurity region is different from the SiC surface portion having proper crystal structure. Accordingly, when the carbon layer is removed, a concavity is formed, which is similar to the sacrifice oxidation step and the step for removing the sacrifice oxidation film. Thus, the thickness of the gate oxide film is deviated, and the reliability of the gate film is reduced.

SUMMARY OF THE INVENTION

In view of the above-described problem, it is an object of the present disclosure to provide a method for manufacturing a SiC semiconductor device.

According to an aspect of the present disclosure, a method for manufacturing a SiC semiconductor device includes: forming an impurity layer in a SiC semiconductor layer; and forming an oxide film on a surface of the SiC semiconductor layer. The forming the impurity layer includes: implanting an impurity in the SiC semiconductor layer; applying a cap layer made of organic solvent on the surface of the SiC semiconductor layer; annealing the cap layer to evaporate the organic solvent so that the cap layer is carbonized and transformed to a carbon layer; annealing the SiC semiconductor layer to activate the impurity in the SiC semiconductor layer under a condition that the surface of the SiC semiconductor layer is covered with the carbon layer; and removing the carbon layer. The forming the oxide film is performed after the removing the carbon layer. The annealing the SiC semiconductor layer includes: a first increasing of a temperature of the SiC semiconductor layer from a second temperature to a first temperature within a first time duration; and a first decreasing of the temperature of the SiC semiconductor layer from the first temperature to the second temperature within a second time duration. The first temperature is equal to or higher than 1800° C., and the second temperature is lower than 1800° C. The first time duration is equal to or smaller than a predetermined time duration, and the second time duration is equal to or smaller than another predetermined time duration.

In the above method, the activation of the impurity is performed within the first and second time duration. Thus, a Si component is prevented from being removed from the surface of the SiC semiconductor layer, and characteristics of the SiC semiconductor device are improved.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

The inventor has preliminarily studied an anneal process for activating an impurity, which has been disclosed in JP-A-2007-281005. Specifically, an impurity is implanted on a wafer, and then, a whole surface of the wafer is covered with a resist. Further, the resist is carbonized in another anneal process so that a carbon layer is formed. Then, the carbon layer is used for a mask, and the anneal process for activating the impurity is performed. More specifically, in a power MOSFET, the carbon layer is used as a mask for a P$^-$ conductive type base region, a N$^+$ conductive type source region, and a surface channel layer. The carbon layer is made of the carbonized resist. Thus, an impurity in each layer is activated.

When the carbon layer is used as a mask, material composing the carbon layer has excellent adhesiveness with a SiC layer, which is a substrate layer. Thus, a Si atom is prevented from being removed from the SiC surface, and a carbon rich layer is not formed on the SiC surface. Thus, it is not necessary to add a step for forming a sacrifice oxide film and a step for removing the sacrifice oxide film so as to remove the carbon rich layer. Further, a concavity is not formed, and a thickness of an oxide film is uniformed. Accordingly, reliability of the oxide film is improved, and performance of the device is also improved.

However, in a case where the carbon layer made of a carbonized resist is used as a mask, when anneal temperature is increased over 1600° C. in order to reduce a sheet resistance of a P conductive type impurity layer, the Si atom may be removed through the carbon layer. Thus, a new carbon layer may be formed under the old carbon layer. In this case, it is required to remove the old carbon layer that is made of the carbonized resist and the new carbon layer after the anneal process for activating the impurity. Accordingly, this removal step is similar to a step for removing a surface portion of the P conductive type impurity layer, so that the surface portion of the P conductive type impurity layer is eliminated, and the sheet resistance may be not reduced. Thus, the proper device characteristics may be not obtained.

In view of the above difficulty, it is required for a manufacturing method of a SiC semiconductor device to obtain proper device characteristics even when anneal process for reducing a resistance of a P conductive type impurity layer is performed. Here, the manufacturing method includes an anneal step for activating an impurity with using a carbon layer made of a carbonized resist as a mask so that an oxide film formed on a SiC surface has a homogeneous thickness.

The inventor studies a relationship between an elapsed anneal process time and thickness of a carbon layer, and a relationship between anneal temperature and the thickness of the carbon layer when the anneal step for activating the impurity is performed over 1600° C.

Figure 9:
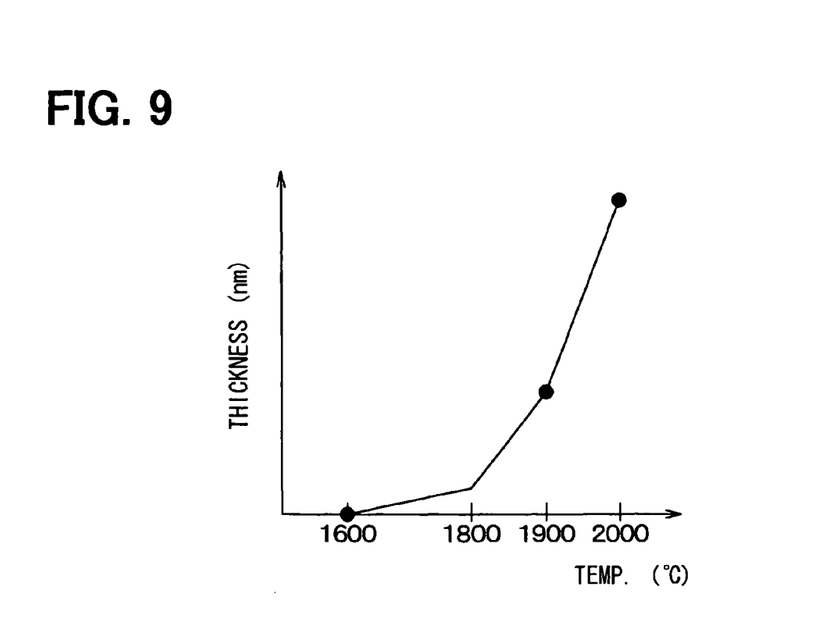
FIG. 9 is a graph showing a relationship between an annealing temperature and a thickness of the carbon layer.

FIG. 9 shows a relationship between the anneal temperature and the thickness of the carbon layer under a condition where the anneal process time duration is constant. At 1600° C., the carbon layer is not formed by removal of the Si component. At a temperature higher than 1800° C., the carbon layer is formed, and the thickness of the carbon layer becomes larger as the anneal temperature increases. The sheet resistance of the P conductive type impurity layer becomes smaller as the anneal temperature increases. However, when the anneal temperature is high, the carbon layer is thick.

Figure 10:
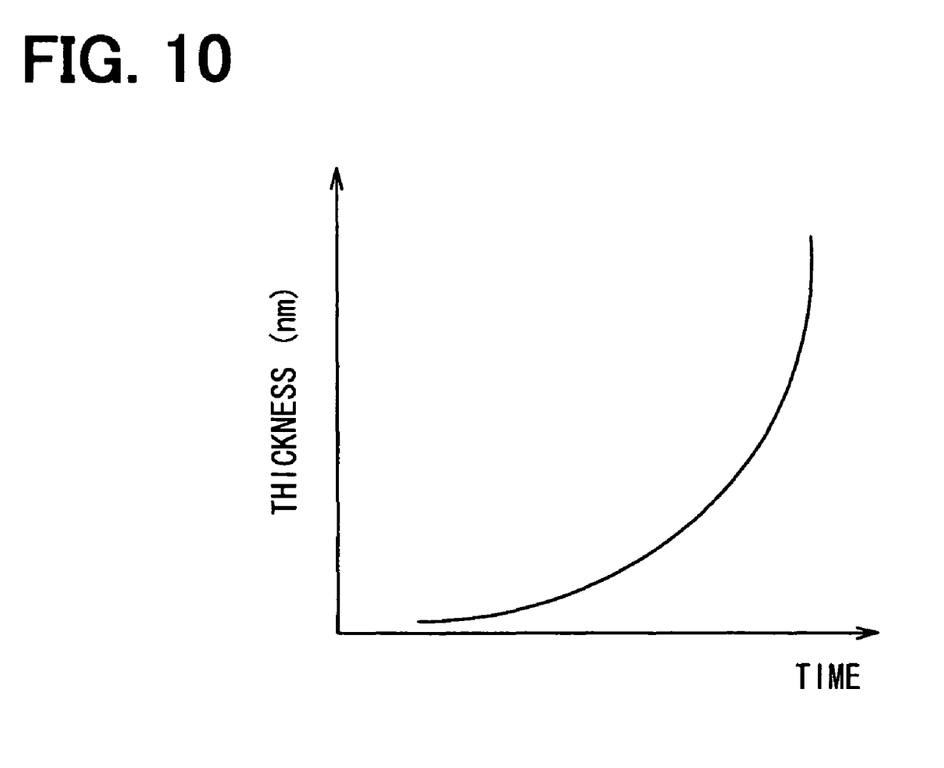
FIG. 10 is a graph showing a relationship between an annealing process time duration and the thickness of the carbon layer.

FIG. 10 shows a relationship between the elapsed anneal process time and the thickness of the carbon layer under a condition where the anneal temperature is 1800° C. Even when the anneal temperature is high, i.e., 1800° C., the carbon layer is not substantially formed as far as the elapsed anneal process time is short. As the elapsed anneal process time becomes longer, the thickness of the carbon layer increases. Accordingly, when the anneal temperature is higher than 1600° C., specifically, when the anneal temperature is equal to or higher than 1800° C., the carbon layer is not substantially formed under a condition where the elapsed anneal process time is short. Thus, the carbon layer is prevented from being formed by removal of the Si component from the surface of the P conductive type impurity layer when the elapsed anneal process time is short. Thus, the sheet resistance is low, and the required device characteristics are obtained.

In the following embodiments, an annealing step for impurity activation is performed such that temperature increases to 1800° C. in a short time duration, and then, the temperature decreases to a predetermined temperature lower than 1800° C. in a short time duration. Thus, the annealing step is performed in a short time duration with high temperature.

First Embodiment

Figure 1:
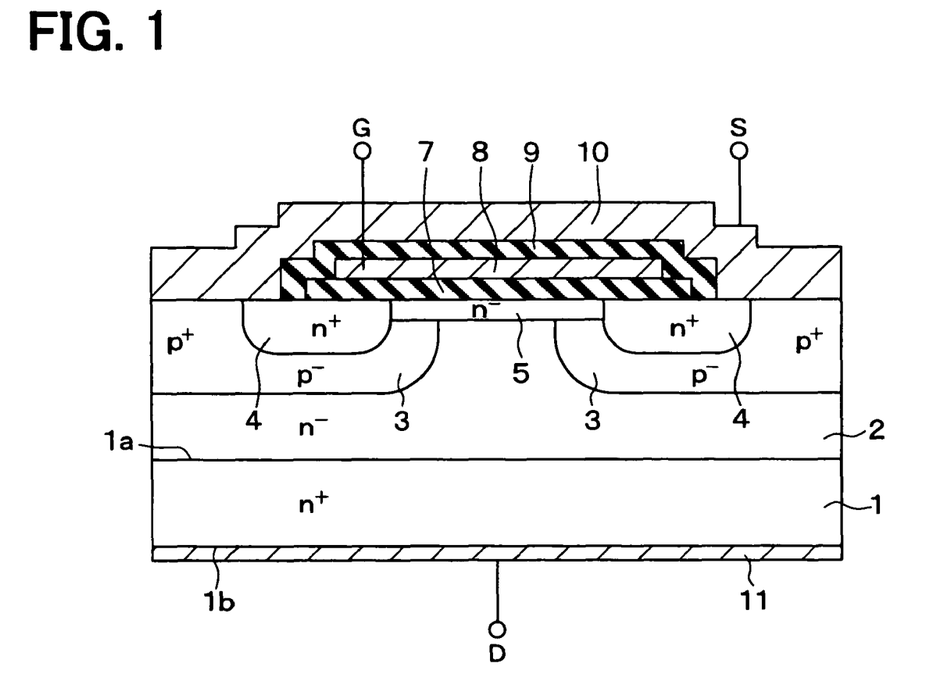
FIG. 1 is a cross sectional view showing a planar MOSFET in a SiC semiconductor device according to a first embodiment.

FIG. 1 shows a SiC semiconductor device having a normally-off type N channel planar MOSFET, which is a vertical power MOSFET. This device is suitably used for an inverter or a rectifier of a vehicle alternator.

The MOSFET includes a $N^+$ conductive type substrate 1 made of SiC. The substrate 1 has an upper side as a principal surface 1a and a lower side as a backside surface 1b, which is opposite to the principal surface 1a. An $N^-$ conductive type epitaxial layer 2 (i.e., $N^-$ epitaxial layer) made of SiC is formed on the principal surface 1a of the substrate 1. The impurity concentration (i.e., dopant concentration) of the $N^-$ epitaxial layer 2 is lower than that of the substrate 1.

A $P^-$ conductive type base region 3 is formed in a surface portion of the epitaxial layer 2. The base region 3 includes a dopant of boron, aluminum or germanium, and an impurity concentration of the base region 3 is equal to or greater than $1\times10^{17}$ cm$^{-3}$. The impurity concentration in the base region 3 is partially increased so that a center portion of the base region 3 has a high impurity concentration. The center portion of the base region 3 is shown as $P^+$ in FIG. 1, which is disposed on each side of the device. The center portion functions as a contact region. The depth of the center portion may be greater than other regions so that the center portion provides a deep base region.

A $N^+$ conductive type source region 4 is formed in a surface portion of the base region 3. The depth of the source region 4 is smaller than that of the base region 3. A $N^-$ conductive type SiC layer 5 is formed to protrude from the base region 3 in a surface portion of the epitaxial layer 2 so that the SiC layer 5 connects the source region 4 and the epitaxial layer 2. The SiC layer 5 is epitaxially grown, and functions as a channel forming layer in case of operation of the device. The SiC layer 5 provides a surface channel layer 5.

A gate oxide film 7 is formed on the upper surface of the surface channel layer 5 and the upper surface of the source region 4, and a gate electrode 8 is formed on the gate oxide film 7. The gate electrode 8 is covered with an insulation film 9 made of LTO (i.e., low temperature oxide). A source electrode 10 is formed on the insulation film 9 such that the source electrode 10 is electrically connected to the source region 4 and the base region 3. A drain electrode 11 is formed on the backside surface 1b of the substrate 1. Thus, the vertical MOSFET is constructed.

A manufacturing method of the power MOSFET is explained as follows with reference to FIGS. 2A to 5B.

Figure 2A:
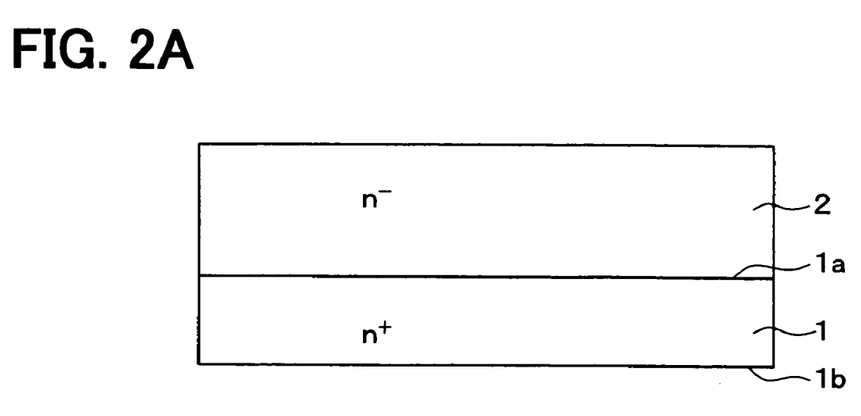
FIGS. 2A to 2C are cross sectional views showing a method for manufacturing the vertical power MOSFET shown in FIG. 1.

In a step shown in FIG. 2A, the semiconductor substrate 1 made of N conductive type 4H—, 6H— or 3C—SiC is prepared. For example, the thickness of the substrate 1 is about 400 μm. The epitaxial layer 2 having a thickness of 5 μm is epitaxially grown on the principal surface 1a of the substrate 1. In this case, the crystal structure of the epitaxial layer 2 is the same as the substrate 1 so that the epitaxial layer 2 is made of N conductive type 4H—, 6H—, or 3C—SiC.

Figure 2B:
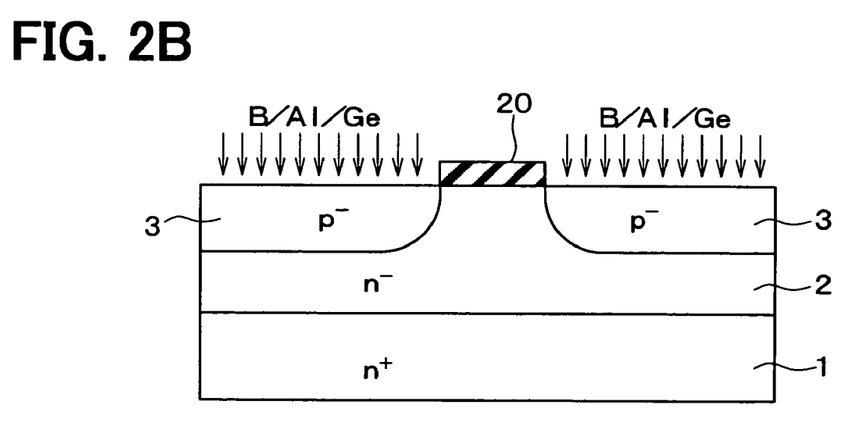
Figure 2C:
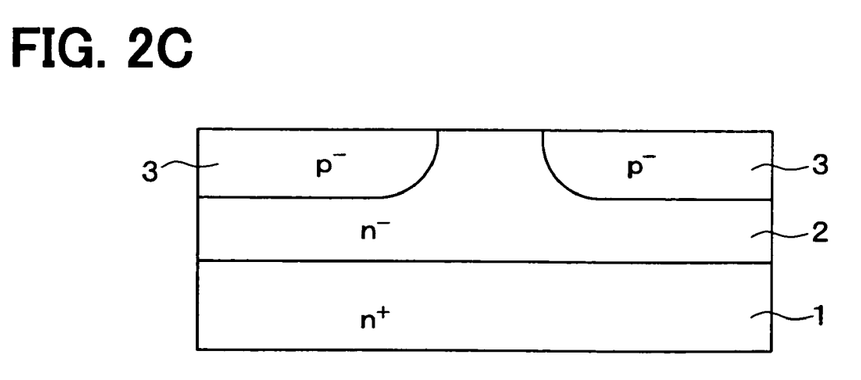

In steps shown in FIGS. 2B and 2C, a LTO film 20 is arranged on the epitaxial layer 2, and the LTO film 20 is patterned so that a base-region-to-be-formed region is exposed from the LTO film 20. By using the LTO film 20 as a mask, a P conductive type impurity of boron, aluminum or germanium is implanted on the epitaxial layer 2. The ion implantation condition is such that, for example, temperature is 700° C., and a dose amount is $1\times10^{16}$ cm$^{-2}$. Thus, the $P^-$ conductive type base region 3 is formed. After that, the LTO film 20 is removed.

Figure 3A:
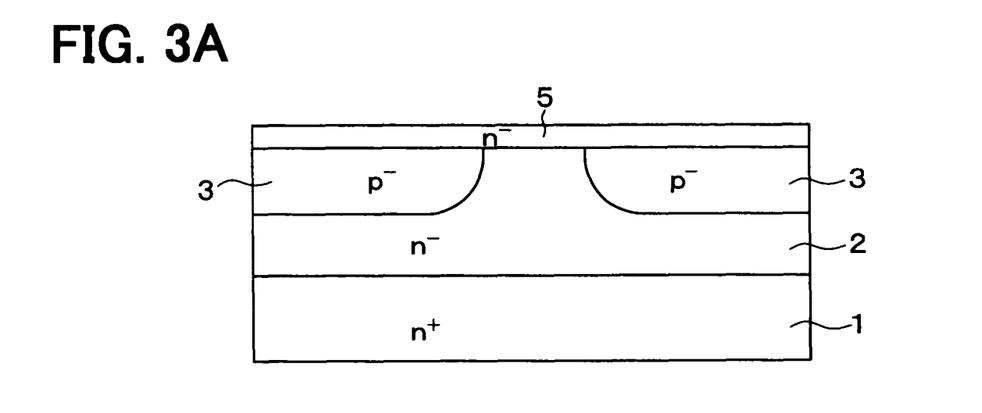
FIGS. 3A to 3C are cross sectional views showing the method for manufacturing the vertical power MOSFET shown in FIG. 1.

In a step shown in FIG. 3A, a surface channel layer 5 is epitaxially grown on the base region 3 and on the epitaxial layer 2.

Here, to provide a normally-off type vertical power MOSFET, the thickness of the surface channel layer 5 is smaller than a sum of extent of a depletion layer from the base region 3 and extent of the depletion layer from the gate oxide film 7. The depletion layer extends from the base region 3 to the surface channel layer 5, and extends from the gate oxide film 7 to the surface channel layer 5, when a voltage is not applied to the gate electrode 8.

Specifically, the extent of the depletion layer from the base region is determined by a built-in voltage of a PN junction between the surface channel layer 5 and the base region 3. The extent of the depletion layer from the gate oxide film 7 is determined by a difference of work function between the gate electrode 8 and the surface channel layer 5 and by a charge on the gate oxide film 7. Thus, the thickness of the surface channel layer 5 is determined based on the above factors.

The normally-off type vertical power MOSFET can prevent the current from flowing therethrough even if the MOSFET is broken and not able to apply a voltage to the gate electrode. Therefore, the normally-off type MOSFET ensures the safety, compared with a normally-on type MOSFET.

Figure 3B:
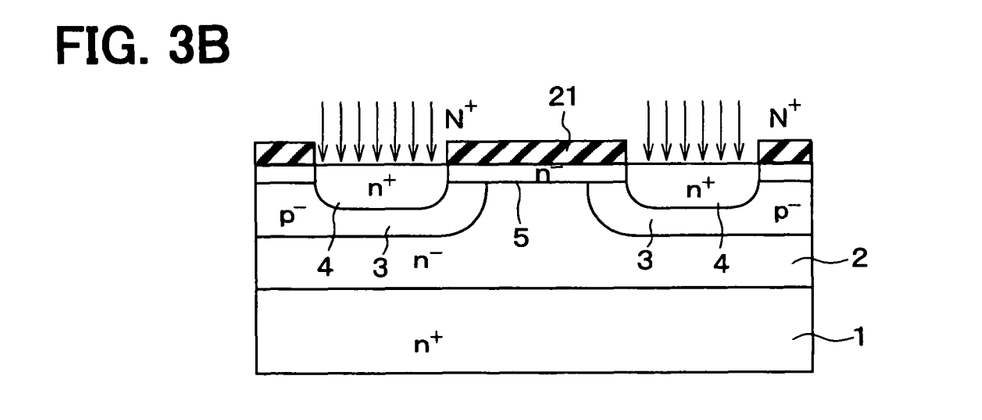

In a step shown in FIG. 3B, the LTO film 21 is formed on the surface channel layer 5, and then, the LTO film 21 is patterned so that a source-region-to-be-formed region is exposed from the LTO film 21. The LTO film 21 is used for a mask, and an N conductive type impurity such as a nitride ion is implanted, so that the $N^+$ conductive type source region 4 is formed. The ion implantation condition is such that temperature is 700° C., and a dose amount is $1\times10^{15}$ cm$^{-2}$.

Figure 3C:
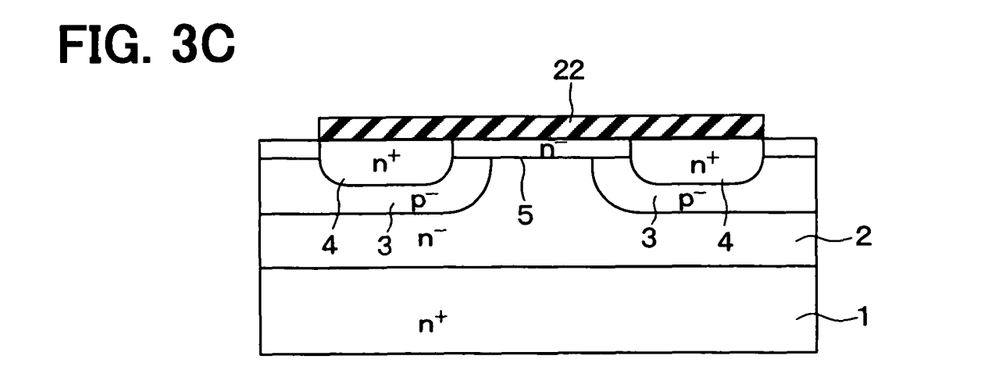

In a step shown in FIG. 3C, the LTO film 21 is removed, and then, another LTO film 22 is formed on the surface channel layer 5 by using a photo lithography method. The LTO film 22 is patterned so that a part of the surface channel layer 5 corresponding to a contact region between the base region 3 and the source electrode 10 is exposed from the LTO film 22.

Figure 4A:
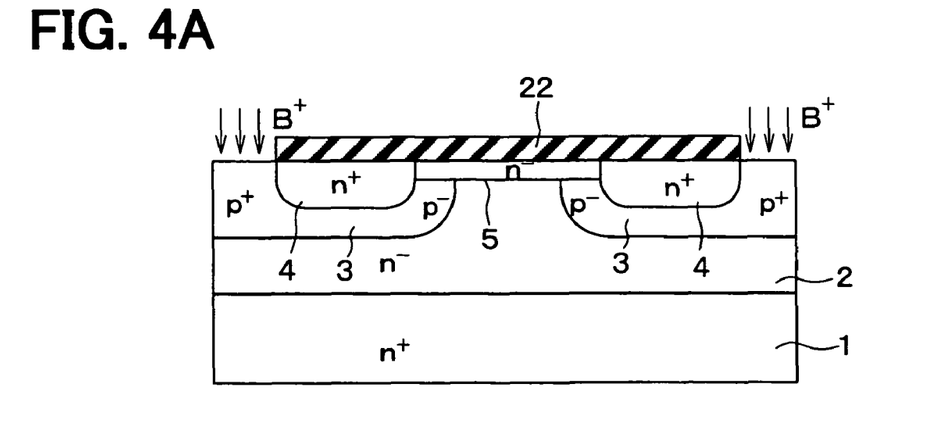
FIGS. 4A to 4C are cross sectional views showing the method for manufacturing the vertical power MOSFET shown in FIG. 1.

In a step shown in FIG. 4A, the LTO film 22 is used fro a mask, and a $B^+$ ion is implanted on the part of the surface channel layer 5 disposed on the base region 3. Thus, a contact region having a high impurity concentration of the P conductive type impurity is formed in the part of the base region 3, which is not overlapped with the source region 4.

Figure 4B:
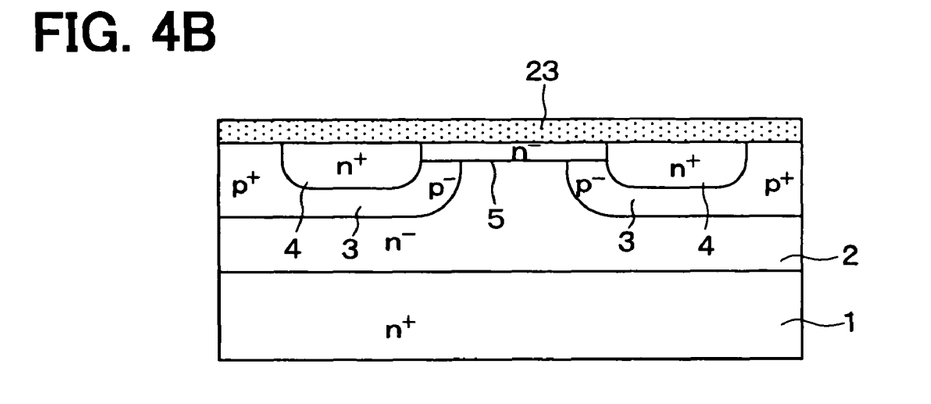

In a step shown in FIG. 4B, the LTO film 22 is removed by a HF processing step. Then, a resist 23 is formed on the base region 3, the source region 4 and the surface channel layer 5. In this case, it is preferably to form the resist 23 by using a spin coat method or a spray coating method because the thickness of the resist 23 is homogeneous.

The resist 23 is made from organic solvent, which is carbonized after organic matter in the organic solvent is vaporized. Here, the organic solvent is a positive type organic solvent such as an I-line photo lithography resist, a deep-UV lithography resist, an ArF lithography resist or an electron beam lithography resist.

Based on an anneal process profiling, the organic matter in the resist 23 is vaporized, so that the carbon layer is formed by carbonizing the resist 23. Further, the impurities in the base region 3 and the source region 4 are activated.

Specifically, atmosphere pressure in equipment for performing the anneal step is reduced so that the pressure in the equipment is equal to or lower than $1\times10^{-4}$ Pa. Thus, the equipment is vacuumed and depressurized. Then, argon gas is introduced into the equipment so that the inside of the equipment is filled with the argon gas. Then, the equipment is heated in such a manner that the temperature of the equipment is equal to or higher than 200° C. and equal to or lower than 850° C. The temperature increase rate is equal to or lower than 80° C./min. For example, the temperature of the equipment is increased with the temperature increase rate of 80° C./min for ten minutes, so that the temperature of the equipment becomes 800° C. Then, the temperature at 800° C. is maintained.

The temperature increase profile is used for carbonizing the resist 23, so that the anneal temperature of 800° C. is lower than that of a step for activating the impurity, and further, the temperature increase rate of 80° C./min is smaller than that of the step for activating the impurity. The anneal temperature is set to be in a range between 200° C. and 850° C. because the resist 23 is sufficiently carbonized at that temperature before the impurity is activated. The temperature increase rate is set to be equal to or lower than 80° C./min. If the temperature increase rate is high, the organic matter in the resist 23 is rapidly boiled, and thereby, a bubble generated by rapid boiling may break the resist 23.

Further, since the anneal temperature equal to or lower than 850° C. is maintained for a predetermined time duration, the organic matter in the resist 23 is surely vaporized. Thus, the carbon layer made of the carbonized resist 23 is surely formed. Further, since the atmosphere in the equipment is argon, residual oxygen amount is small in the equipment. Therefore, when the carbon layer is formed, the resist 23 does not burn with the residual oxygen.

Since the carbon layer is made of the carbonized resist 23, the carbon layer can cover whole surface of the base region 3, the source region 4 and the surface channel layer 5.

After the carbon layer is formed, the temperature increase rate may be set to be large. Specifically, after formation of the carbon layer, the temperature increase rate is set to be equal to or larger than 160° C./min so that the temperature of the equipment increases to the anneal process temperature, at which the impurity is activated. For example, the equipment is heated with the temperature increase rate of 160° C./min for five minutes so that the temperature of the equipment increases from 800° C. to 1600° C.

At this time, since the carbon layer covers the base region 3, the source region 4 and the surface channel layer 5, the silicon component is prevented from being removed from each surface of the base region 3, the source region 4 and the surface channel layer 5. Thus, the carbon rich layer is not formed on the surface of the base region 3, the source region 4 and the surface channel layer 5. Further, the carbon layer has good adhesiveness with SiC material, which provides a base such as the base region 3, the source region 4 and the surface channel layer 5. The carbon layer does not remove from the base, and covers the base sufficiently. Thus, the anneal process for activating the impurity is performed with covering the base sufficiently.

The impurity in the base region 3 and the source region 4 is activated. In this embodiment, to activate the base region 3 as the P conductive type impurity layer, specifically, to activate a contact region of the base region 3, the anneal process with high temperature higher than 1800° C. for a short process time duration is performed. Specifically, the anneal process is performed at a temperature lower than 1800° C. for thirty minutes or more, and during the anneal process, the temperature is increased to be higher than 1800° C. More specifically, the temperature of the equipment is maintained at 1600° C. for thirty minutes or more so that crystal defect in an impurity implantation layer is recovered, and the temperature is increased to 2000° C. within a short time duration. In this case, the temperature increase rate is equal to or larger than 400° C./min, for example, the temperature increase rate is 400° C./sec. The temperature decrease rate is equal to or larger than 400° C./min, for example, the temperature decrease rate is 400° C./sec. Thus, the time duration in which the temperature is higher than 1800° C. is shortened. To perform such a short time temperature increase and temperature decrease, a lamp annealing method, a laser annealing method or the like is used. Here, the short time annealing method is disclosed in, for example, JP-A-2002-289546. The short time annealing process may be performed locally on a part, at which the lamp or the laser is irradiated. Alternatively, the short time annealing process may be performed on a whole of a wafer.

Here, the short time duration is determined based on a relationship among the maximum temperature, the process time duration and the thickness of a newly formed carbon layer. Here, the newly formed carbon layer is formed by silicon component removal from a surface of the base such as the base region 3, which is disposed under the carbon layer. The maximum temperature is the highest temperature in the annealing process. For example, the short time duration in a case where the maximum temperature is 1800° C. is different from that in a case where the maximum temperature is 2000° C. When the maximum temperature is high, the short time duration becomes small. Therefore, as the maximum temperature becomes high, and as the annealing time duration in which the temperature is higher than 1800° C. becomes longer, the thickness of the newly formed carbon layer increases. The newly formed carbon layer is formed by removing the silicon component from the surface of the base region 3. The short time duration is determined in view of these factors. For example, the temperature is increased with 400° C./min or 400° C./sec from 1600° C. to 2000° C., and then, the temperature is decreased with 400° C./min or 400° C./sec from 2000° C. to 1600° C.

Figure 7:
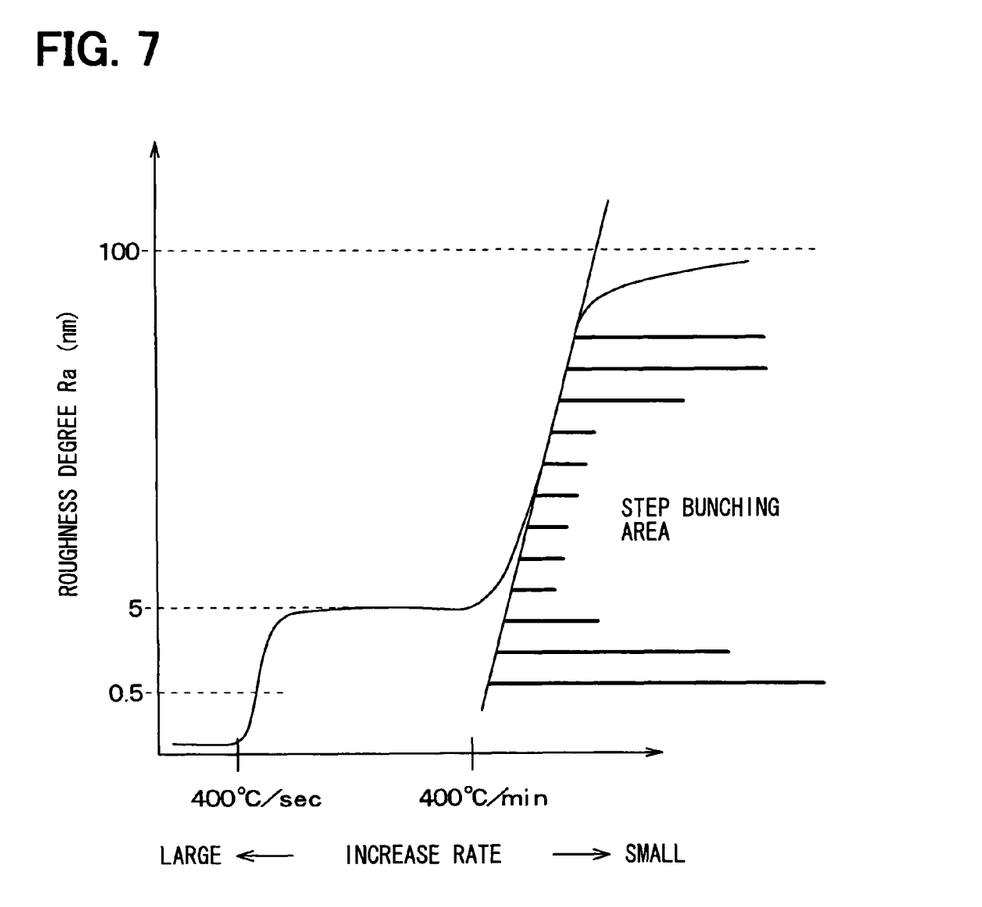
FIG. 7 is a graph showing a relationship between an annealing process condition, surface roughness degree and step bunching occurrence.

FIG. 7 shows a relationship between annealing conditions such as the annealing process time duration and the annealing temperature and occurrence of surface roughness and step bunching. When the temperature increase rate is equal to or larger than 400° C./sec, the surface roughness does not occur. When the temperature increase rate is in a range between 400° C./sec and 400° C./min, the surface roughness occurs, but the step bunching does not occur. When the temperature increase rate is smaller than 400° C./min, the step bunching occurs. Thus, the device characteristics are much affected by the step bunching. Thus, it is required to set the temperature increase and decrease rate to be equal to or larger than 400° C./min. Preferably, the temperature increase and decrease rate is set to be larger than 400° C./sec.

Thus, the maximum annealing temperature is set to be equal to or higher than 1800° C. so that the sheet resistance of the base region 3 is reduced, and the thickness of the newly formed carbon layer by the silicon component removal from the surface of the base region 3 is reduced. Accordingly, after the annealing process, when the carbon layer is removed, only a thin portion of the surface of the base region 3 is removed. The thin portion corresponds to the newly formed carbon layer. Accordingly, the sheet resistance of the base region 3 is improved, and the required device characteristics are obtained.

Figure 4C:
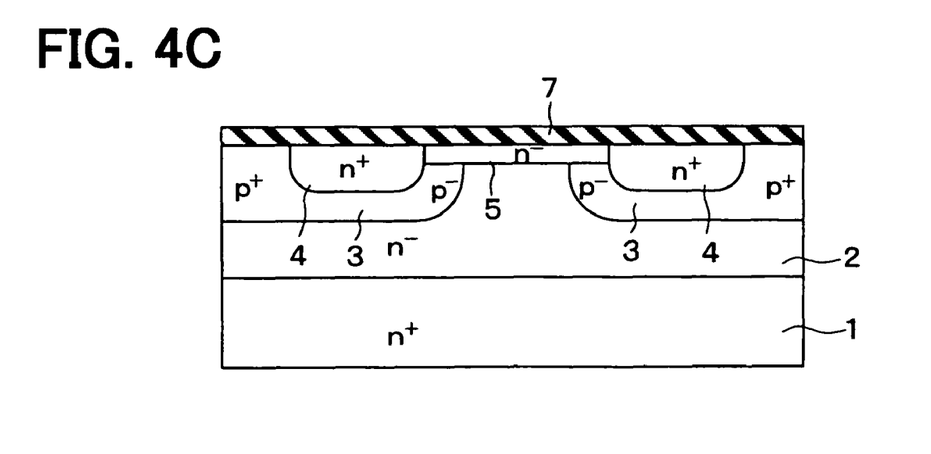

In a step shown in FIG. 4C, the carbon layer and the newly formed carbon layer are removed. Specifically, the thermal oxidation process is performed at temperature equal to or lower than 850° C., at which the SiC material is not oxidized and the silicon component is not removed. For example, the thermal oxidation process is performed at 800° C., so that the carbon layer burns. Thus, the carbon layer is removed. The thermal oxidation process for removing the carbon layer may be performed by a dry oxidation process or a wet oxidation process. If necessary, a surface cleaning process with using a HF acid may be performed so that a surface of the device is cleaned.

Then, for example, the gate oxide film 7 is formed on the base region 3, the source region 4 and the surface channel layer 5 in a wet oxidation process including a pyrogenic method at atmospheric temperature of 1080° C. In the pyrogenic method, mixture of oxygen gas and hydrogen gas is used.

The impurity concentration of the base region 3 is difference from that of the source region 4 and the surface channel layer 5. In a portion having a high impurity concentration, speed multiplication oxidation occurs. However, no concavity is formed on the surface of the base, i.e., on the surface of the base region 3, the source region 5 and the surface channel layer 5. Here, the concavity is generally formed in the sacrifice oxidation film formation step and in the sacrifice oxidation film removal step. Accordingly, even when the gate oxide film 7 is formed, the deviation of thickness of the gate oxide film 7 is reduced. The reliability of the gate oxide film 7 is improved, and the device characteristics are improved.

Figure 5A:
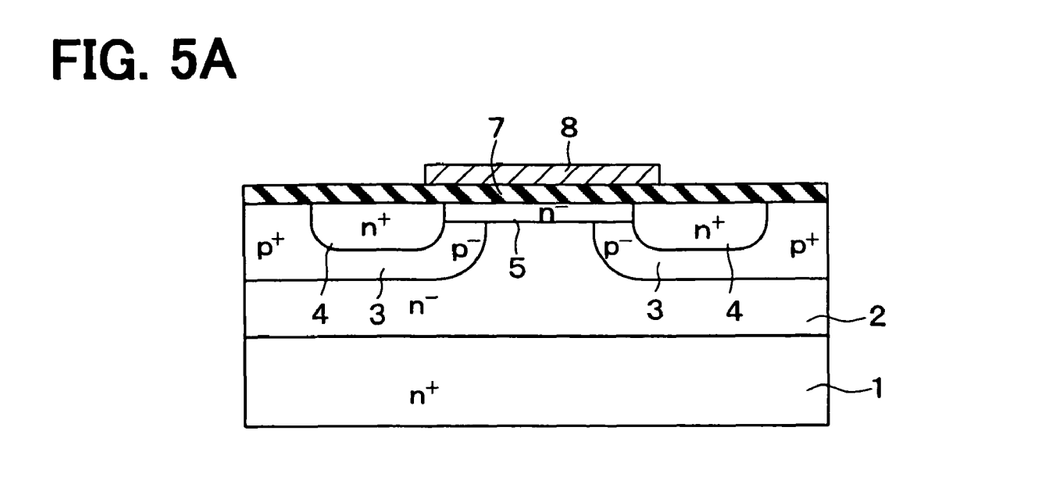
FIGS. 5A to 5B are cross sectional views showing the method for manufacturing the vertical power MOSFET shown in FIG. 1.

In a step shown in FIG. 5A, a poly silicon layer is formed on the gate oxide 7 by a LPCVD method or the like. In this case, the deposition temperature is, for example, 600° C. The poly silicon layer is patterned, so that the gate electrode 8 is formed.

Figure 5B:
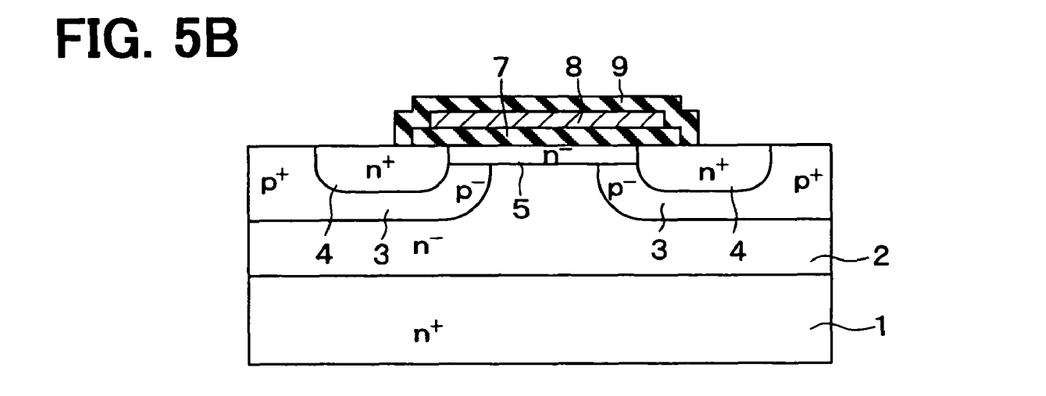
Figure 6:
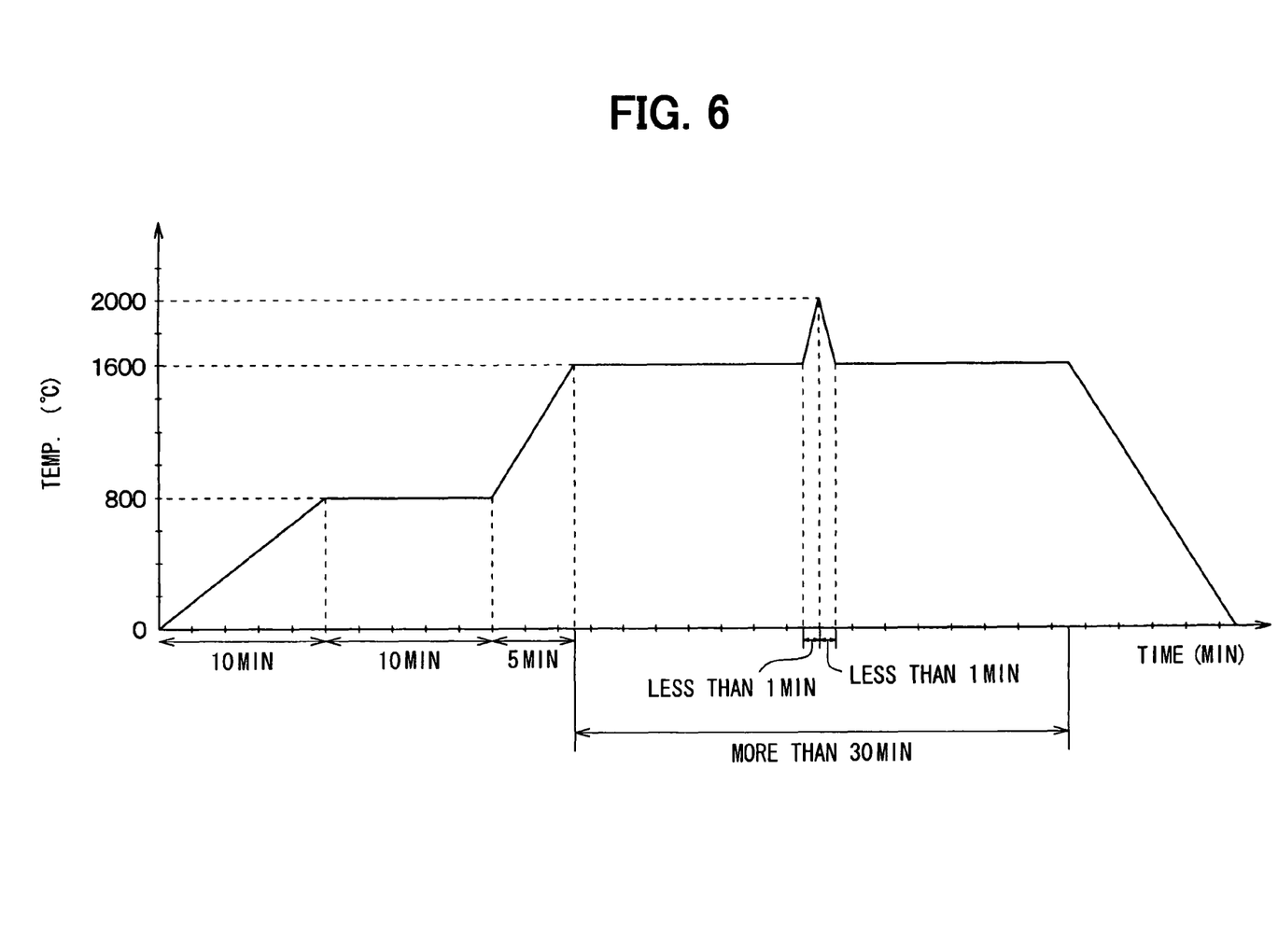
FIG. 6 is a graph showing an annealing process profile in the method for manufacturing the vertical power MOSFET.

In a step shown in FIG. 5B, after an unnecessary part of the gate oxide film 7 is removed, the insulation film 9 made of LTO is formed at 425° C. Successively, an anneal step at 1000° C. is performed so that the gate electrode 8 is covered with the insulation film 9.

Then, the source electrode 10 and the drain electrode 11 are formed by a metal sputtering method at a room temperature. After deposition of the source electrode 10 and the drain electrode 11, the anneal step at 1000° C. is performed. Thus, the vertical power MOSFET is completed.

The MOSFET works in a normally-off type accumulation mode. Specifically, the operation of the MOSFET will be explained as follows. When a voltage is not applied to the gate electrode 8, the surface channel layer 5 is entirely depleted by an electric potential, which is generated by a difference of work function between the surface channel layer 5 and the gate electrode 8 and by a difference of electrostatic potential between the base region 3 and the surface channel layer 5.

When the voltage is applied to the gate electrode 8, an electric potential difference generated by a sum of the applied voltage and the work function difference between the surface channel layer 5 and the gate electrode 8 is changed. Thus, the channel of the device is controlled.

In case of an off state, the electric field formed by the base region 3 and the gate electrode 8 provides the depletion layer in the surface channel layer 5. Under this condition, when a positive bias voltage is applied to the gate electrode 8, a channel region is formed at a boundary between the gate oxide film 7 and the surface channel layer 5 so that the device switches from the off state to an on state. The channel region extends from the source region 4 to the epitaxial layer 2. Thus, the electrons flows from the source region 4 to the substrate 1, i.e., the drain through the surface channel layer 5 and the epitaxial layer 2, i.e., the drift region. The direction from the epitaxial layer 2 to the substrate 1 is perpendicular to the substrate 1.

Thus, when the positive voltage is applied to the gate electrode 8, an accumulation type channel is induced in the surface channel layer 5 so that a carrier can flows between the source electrode 10 and the drain electrode 11.

In this embodiment, the carbon layer is formed by carbonizing the resist 23. By using the carbon layer, the short time annealing process is performed at a temperature higher than 1800° C. so that the impurity is activated. By annealing at the temperature higher than 1800° C., the sheet resistance of the base region 3 is reduced, and the thickness of the newly formed carbon layer formed by silicon component removal from the surface of the base region 3 is reduced. Accordingly, after the carbon layer is removed, the surface part of the base region which provides the newly formed carbon layer is thin, so that only the thin surface part of the base region is removed. Thus, the sheet resistance of the base region 3 is low, and the required device characteristics are obtained.

Second Embodiment

In the first embodiment, the short time annealing at the temperature higher than 1800° C. is performed only once. Alternatively, the short time annealing at the temperature higher than 1800° C. may be performed multiple times. If the annealing steps at the temperature higher than 1800° C. are performed continuously, as shown in FIG. 10, when the total process time duration is long, the thickness of the newly formed carbon layer becomes large. However, since the process time duration of each short time annealing step is small, although the total process time duration is large, the thickness of the newly formed carbon layer does not increase along with a curve shown in FIG. 10. Alternatively, the thickness of the newly formed carbon layer increases by a predetermined value corresponding to each short time annealing step. Accordingly, when the short time annealing process is divided into multiple short time annealing steps, and the short time annealing steps at the temperature higher than 1800° C. are individually and separately performed so that the sheet resistance of the base region 3 is much reduced.

Other Embodiments

In the first embodiment, the annealing process for carbonizing the resist 23 and for activating the impurity is performed in argon gas atmosphere. Alternatively, the annealing process may be performed in decompressed atmosphere such as in vacuum so that residual oxygen partial pressure is small. In this case, since the residual oxygen contributes to burn the resist 23 or the carbon layer, the residual oxygen percentage is set to be equal to or smaller than 1%.

Alternatively, the residual oxygen gas may be replaced with the argon gas so that the residual oxygen is reduced in the atmosphere, in which the annealing process is performed. In this case, to reduce the residual oxygen gas sufficiently, multiple replacing steps with the argon gas are performed. In the inventor's experiment, when the number of replacing steps is equal to or larger than three, the residual oxygen gas is sufficiently reduced so that the resist 23 and the carbon layer does not burn substantially.

In the first embodiment, the annealing process profile for carbonizing the resist 23 so as to form the carbon layer is different from that for activating the impurity. Thus, multiple annealing process profiles are prepared so that the carbon layer is effectively formed.

Alternatively, the annealing process profile for forming the carbon layer may be the same as that for activating the impurity. For example, the resist 23 may be carbonized by heating with the temperature increase rate of 160° C./min, which is the same as that in the annealing process profile for activating the impurity. In this case, the carbon layer may be broken by boiling of the organic matter although the manufacturing process is simplified. Alternatively, the impurity may be activated by heating with the temperature increase rate equal to or smaller than 80° C./min up to 1600° C., the temperature increase rate which is the same as that in the annealing process profile for forming the carbon layer. In this case, the process time duration may be longer although the manufacturing process is simplified.

Figure 8:
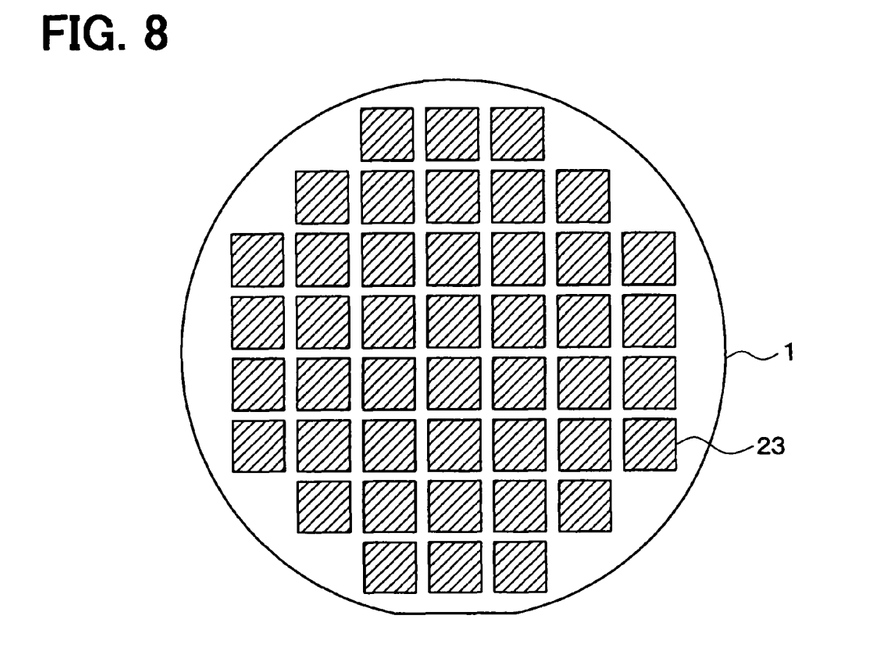
FIG. 8 is a plan view showing a wafer with multiple parts of a carbon layer.

In the first embodiment, the resist 23 is formed on whole surface of the substrate 1. Alternatively, as shown in FIG. 8, the resist 23 may be divided into multiple parts, each of which corresponds to a semiconductor chip. Specifically, the wafer includes multiple chips, and one chip corresponds to one SiC semiconductor device. The dimensions of the chip are, for example, three millimeters square. And, each part of the resist 23 covers the one chip. In this case, since the area of the resist 23 is divided to fine areas. Therefore, the resist 23 does not easily tear.

In the first embodiment, there is no sacrifice oxide film formation step and no sacrifice oxide film removal step. Alternatively, if necessary, the sacrifice oxide film formation step and the sacrifice oxide film removal step may be additionally performed.

Since the annealing process for activating the impurity is performed with covering with the mask, the silicon component is prevented from being removed. Further, the carbon rich layer is not formed, and therefore, it is not necessary to remove the carbon rich layer. Accordingly, even if the sacrifice oxidation process is performed, the thickness to be removed in the sacrifice oxidation process is small. For example, in a conventional method, it is necessary to remove the carbon layer having 30 nm thickness. However, in the above case, only a part of the impurity layer having a few to 10 nm thickness may be removed in the sacrifice oxidation process.

Accordingly, after the annealing process for activating the impurity is performed with covering with the mask, the sacrifice oxidation process including the sacrifice oxide film formation step and the sacrifice oxide film removal step may be performed. Even in such a case, an oxidation process time duration in the sacrifice oxide film formation step is very short, compared with the conventional method. Thus, a height of the concavity is much smaller than that of the conventional method.

Although the SiC semiconductor device includes the vertical power MOSFET, the SiC semiconductor device may include other devices as far as an oxide film is formed on the surface of the SiC material including an impurity to prevent the concavity from being formed by speed multiplication oxidation.

The above disclosure has the following aspects.

According to an aspect of the present disclosure, a method for manufacturing a SiC semiconductor device includes: forming an impurity layer in a SiC semiconductor layer; and forming an oxide film on a surface of the SiC semiconductor layer. The forming the impurity layer includes: implanting an impurity in the SiC semiconductor layer; applying a cap layer made of organic solvent on the surface of the SiC semiconductor layer; annealing the cap layer to evaporate the organic solvent so that the cap layer is carbonized and transformed to a carbon layer; annealing the SiC semiconductor layer to activate the impurity in the SiC semiconductor layer under a condition that the surface of the SiC semiconductor layer is covered with the carbon layer; and removing the carbon layer. The forming the oxide film is performed after the removing the carbon layer. The annealing the SiC semiconductor layer includes: a first increasing of a temperature of the SiC semiconductor layer from a second temperature to a first temperature within a first time duration; and a first decreasing of the temperature of the SiC semiconductor layer from the first temperature to the second temperature within a second time duration. The first temperature is equal to or higher than 1800° C., and the second temperature is lower than 1800° C. The first time duration is equal to or smaller than a predetermined time duration, and the second time duration is equal to or smaller than another predetermined time duration.

In the above method, the activation of the impurity is performed within the first and second time duration. Thus, a Si component is prevented from being removed from the surface of the SiC semiconductor layer, and characteristics of the SiC semiconductor device are improved.

Alternatively, the first increasing of the temperature of the SiC semiconductor layer may have a temperature increase rate equal to or larger than 400° C./min. Further, the first increasing of the temperature of the SiC semiconductor layer may have a temperature increase rate equal to or larger than 400° C./sec.

Alternatively, the first decreasing of the temperature of the SiC semiconductor layer may have a temperature decrease rate equal to or larger than 400° C./min. Further, the first decreasing of the temperature of the SiC semiconductor layer may have a temperature decrease rate equal to or larger than 400° C./sec.

Alternatively, the first temperature may be 2000° C. Alternatively, the annealing the SiC semiconductor layer may further include: a second increasing of the temperature of the SiC semiconductor layer from the second temperature to the first temperature within the first time duration; and a second decreasing of the temperature of the SiC semiconductor layer from the first temperature to the second temperature within the second time duration.

Alternatively, the annealing the SiC semiconductor layer may further include: maintaining the temperature of the SiC semiconductor layer at the second temperature for a third time duration equal to or greater than thirty minutes. The first increasing of the temperature of the SiC semiconductor layer and the first decreasing of the temperature of the SiC semiconductor layer are performed during the maintaining temperature of the SiC semiconductor layer. Further, the first temperature may be 2000° C., and the second temperature may be 1600° C., and the first time duration may be equal to or smaller than one minute, and the second time duration may be equal to or smaller than one minute. Furthermore, the annealing the cap layer may have a temperature increase rate equal to or smaller than 80° C./min. The annealing the cap layer includes: increasing a temperature of the cap layer to a third temperature; and maintaining the temperature of the SiC semiconductor layer at the third temperature for a fourth time duration equal to or greater than ten minutes. The third temperature is in a range between 200° C. and 850° C. Further, the cap layer may be made of an I-line photo lithography resist, a deep-UV lithography resist, an ArF lithography resist or an electron beam lithography resist, and the annealing the cap layer may further include: setting atmosphere around the SiC semiconductor device to include oxygen gas equal to or smaller than 1%.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A method for manufacturing a SiC semiconductor device comprising:
forming an impurity layer in a SiC semiconductor layer; and
forming an oxide film on a surface of the SiC semiconductor layer, wherein
the forming the impurity layer includes:
implanting an impurity in the SiC semiconductor layer;
applying a cap layer made of organic solvent on the surface of the SiC semiconductor layer;
annealing the cap layer to evaporate the organic solvent so that the cap layer is carbonized and transformed to a carbon layer;
annealing the SiC semiconductor layer to activate the impurity in the SiC semiconductor layer under a condition that the surface of the SiC semiconductor layer is covered with the carbon layer; and
removing the carbon layer,
the forming the oxide film is performed after the removing the carbon layer,
the annealing the SiC semiconductor layer includes:
a first increasing of a temperature of the SiC semiconductor layer from a second temperature to a first temperature within a first time duration;
a first decreasing of the temperature of the SiC semiconductor layer from the first temperature to the second temperature within a second time duration;
a second increasing of the temperature of the SiC semiconductor layer from the second temperature to the first temperature within the first time duration; and
a second decreasing of the temperature of the SiC semiconductor layer from the first temperature to the second temperature within the second time duration,
the first temperature is equal to or higher than 1800° C., and the second temperature is lower than 1800° C.,
the first time duration is equal to or smaller than a predetermined time duration, and the second time duration is equal to or smaller than another predetermined time duration, and
the predetermined time duration is one minute, and the another predetermined time duration is one minute.

2. The method according to claim 1, wherein
the first increasing of the temperature of the SiC semiconductor layer has a temperature increase rate equal to or larger than 400° C./min.

3. The method according to claim 2, wherein
the first increasing of the temperature of the SiC semiconductor layer has a temperature increase rate equal to or larger than 400° C./sec.

4. The method according to claim 1, wherein
the first decreasing of the temperature of the SiC semiconductor layer has a temperature decrease rate equal to or larger than 400° C./min.

5. The method according to claim 4, wherein
the first decreasing of the temperature of the SiC semiconductor layer has a temperature decrease rate equal to or larger than 400° C./sec.

6. The method according to claim 1, wherein
the first temperature is 2000° C.

7. A method for manufacturing a SiC semiconductor device comprising:
forming an impurity layer in a SiC semiconductor layer; and
forming an oxide film on a surface of the SiC semiconductor layer, wherein
the forming the impurity layer includes:
implanting an impurity in the SiC semiconductor layer;
applying a cap layer made of organic solvent on the surface of the SiC semiconductor layer;
annealing the cap layer to evaporate the organic solvent so that the cap layer is carbonized and transformed to a carbon layer;
annealing the SiC semiconductor layer to activate the impurity in the SiC semiconductor layer under a condition that the surface of the SiC semiconductor layer is covered with the carbon layer; and
removing the carbon layer,
the forming the oxide film is performed after the removing the carbon layer,
the annealing the SiC semiconductor layer includes:
a first increasing of a temperature of the SiC semiconductor layer from a second temperature to a first temperature within a first time duration;
a first decreasing of the temperature of the SiC semiconductor layer from the first temperature to the second temperature within a second time duration; and
maintaining the temperature of the SiC semiconductor layer at the second temperature for a third time duration equal to or greater than thirty minutes,
the first increasing of the temperature of the SiC semiconductor layer and the first decreasing of the temperature of the SiC semiconductor layer being performed during the maintaining the temperature of the SiC semiconductor layer,
the first temperature is equal to or higher than 1800° C., and the second temperature is lower than 1800° C., and
the first time duration is equal to or smaller than a predetermined time duration, and the second time duration is equal to or smaller than another predetermined time duration.

8. The method according to claim 7, wherein
the first temperature is 2000° C., and the second temperature is 1600° C.

9. The method according to claim 8, wherein
the annealing the cap layer has a temperature increase rate equal to or smaller than 80° C./min,
the annealing the cap layer includes:
increasing a temperature of the cap layer to a third temperature; and
maintaining the temperature of the SiC semiconductor layer at the third temperature for a fourth time duration equal to or greater than ten minutes, and
the third temperature is in a range between 200° C. and 850° C.

10. The method according to claim 9, wherein
the cap layer is made of an I-line photo lithography resist, a deep-UV lithography resist, an ArF lithography resist or an electron beam lithography resist, and
the annealing the cap layer further includes:
setting atmosphere around the SiC semiconductor device to include oxygen gas equal to or smaller than 1%.

* * * * *